United States Patent [19]

Lun

[11] Patent Number: 5,888,579
[45] Date of Patent: Mar. 30, 1999

[54] METHOD AND APPARATUS FOR PREVENTING PARTICLE CONTAMINATION IN A PROCESS CHAMBER

[75] Inventor: Tseng Te Lun, Long Tan Township, Taiwan

[73] Assignee: Texas Instruments-Acer Incorporated, Hsinchu, Taiwan

[21] Appl. No.: 681,718

[22] Filed: Jul. 29, 1996

[51] Int. Cl.$^6$ .................................................. C23C 16/00
[52] U.S. Cl. ...................... 427/8; 427/248.1; 427/255.2; 216/59; 118/692; 118/715; 156/345
[58] Field of Search .......................... 427/8, 248.1, 255.2; 216/59; 118/692, 715; 156/345

[56] References Cited

FOREIGN PATENT DOCUMENTS 3-151629   6/1991   Japan ....................................... 118/715

*Primary Examiner*—Richard Bueker
*Attorney, Agent, or Firm*—Tung & Associates

[57] ABSTRACT

The present invention is concerned with a method and apparatus for preventing particle contamination in a semiconductor process chamber wherein a contaminant purge system is utilized which has a first end connected in fluid communication with a conduit connecting between a pressure sensor and a manifold, and a second end connected in fluid communication with an exhaust system such that a purge gas carries contaminant particles from the conduit to the exhaust system and away from the process chamber.

18 Claims, 1 Drawing Sheet

METHOD AND APPARATUS FOR PREVENTING PARTICLE CONTAMINATION IN A PROCESS CHAMBER

FIELD OF THE INVENTION

The present invention generally relates to a method and apparatus for semiconductor processing and more particularly, relates to a method and apparatus for preventing particle contamination in a semiconductor processing chamber that is equipped with a processing parameter monitoring device and a conduit connecting the device to the processing chamber.

BACKGROUND OF THE INVENTION

In semiconductor processing, a large percentage of the yield losses can be attributed to contaminations by particles and films of various nature. The contaminants may be organic or inorganic particles, films formed of polymeric bases, or other ionic based materials. The particles or films can be generated as a byproduct in the reaction of reactant gases, by the surrounding environment, by the processing equipment or by the handling of manufacturing personnel. Some contaminants are particles or films generated from condensed organic vapors, solvent residues, photoresist or metal oxide compounds.

Typical problems and the detrimental effects caused by particle or film contaminants are the poor adhesion of deposited layers, or the poor etching of the underlying material. The electrical properties and the stability of devices built on the semiconductor substrate may also be seriously affected by ionic based contaminants. The various forms of contaminants therefore not only reduce the product yield but also degrades the reliability of the devices built. For instance, contaminant particles can cause a device to fail by improperly defined patterns, by creating unpredictable surface topography, by inducing leakage current through insulating layer, or otherwise reducing the device lifetime. It is generally recognized that a particle contaminant that exceeds one-fifth to one-half of a minimum feature size on a device has the potential of causing a fatal defect, i.e. a defect that causes a device to fail completely. A defect of smaller size may also be fatal if it falls in a critical area, for instance, a particle contaminant in the gate oxide layer of a transistor. In modern high density devices, such as a dynamic random access memory chip, the maximum allowable number of particle contaminants per unit area of the device must be reduced accordingly in order to maintain an acceptable yield and reliability.

A typical low pressure chemical vapor deposition (LPCVD) system can be carried out in an apparatus as that shown in FIG. 1.

Referring initially to FIG. 1 wherein a conventional chemical vapor deposition system 10 is shown. The chemical vapor deposition method has been widely used in the deposition of silicon nitride films on semiconductor substrates. In this method, a gas containing the structural elements of the film material to be formed is fed into a chamber, followed by heating the gas mixture to induce a chemical reaction to deposit the desired film on the semiconductor substrate. In a conventional CVD method, a silicon nitride film can be deposited by a chemical reaction between silane ($SiH_4$) and ammonia ($NH_3$) at the atmospheric pressure and a temperature of 700°~900° C., or by a mixture of dichlorosilane ($SiCl_2H_2$) and ammonia at a reduced pressure and at a temperature of 700°~800° C.

As shown in FIG. 1, reactant gases of dichlorosilane 12 and ammonia 14, each carried by a carrier gas of nitrogen, are fed into the process chamber 18 through the inner tubes 40. The reaction gases are mixed at the bottom portion of inner tubes 40. Manifold 16 provides inlets and outlets for the gases and is used as a pedestal support for the inner tubes 40 and the outer tubes 24. The process chamber 18 is first evacuated by vacuum pump 20 prior to the reaction. A purge gas of nitrogen 22 is then used to fill the process chamber 18 and to drive out any residual gas left from the previous deposition cycle. A cold trap 26 maintained at sub-ambient temperature, e.g., approximately 12°~18° C. is used in the vacuum line to trap particles that cannot be pumped away. The manifold 16 is provided with a pressure sensor 28 which is connected via a conduit 30 to the manifold 16 at a pressure port 32. A main valve 34 and a sub-valve 36, as well as pressure switches 42 and 44 are provided in the vacuum evacuation line for controlling the fluid flow. A vent line 48 is connected to the vacuum evacuation line between the two pressure switches 42 and 44 for venting spent reactant gases through control valves 52 and 54 to the exhaust vent 56. The switch 42 can be a 760 Torr pressure switch, while the switch 44 can be a 800 Torr pressure switch. When the pressure in chamber 18 reaches atmospheric pressure, switch 42 sends a signal to trigger a solenoid valve to open control valve 52 so that gas can vent from the chamber. Pressure switch 44 is a backup switch which acts in case of a malfunction of switch 42. This prevents process chamber 18 from being damaged by excessive gas pressure. For instance, switch 44 sends a signal to open control valve (or air valve) 54 when chamber pressure reaches 800 Torr.

After the reactant gases of $SiCl_2H_2$ and $NH_3$ are mixed in the inner tube 40, the gas mixture is flown into the process chamber 18 to deposit silicon nitride films on wafers held in a wafer boat. (Not shown). It has been observed that during the reaction between $SiCl_2H_2$ and $NH_3$, a reaction byproduct of $NH_4Cl$ in a white power form, is produced. The ammonium chloride powder is frequently trapped in the conduit 30 at near the pressure port 32 that is connected to the pressure sensor 28. The white powdery residue deposited at the pressure port 32 and in the conduit 30 is very difficult to remove due to the fact that there is no purge gas flowing through either the port or the conduit. The accumulation of ammonium chloride powder at the port and in the conduit creates a serious contamination problem in the process chamber 18. During a silicon nitride film deposition cycle, the ammonium chloride particles may enter into the chamber and contaminate a substrate surface that is to be deposited with silicon nitride films. The purge gas of nitrogen 22 is directly flown into the process chamber 18 at outlet 24 and also from 12 and 14 as carrier gas for the reactant gas which then exits the chamber at outlet 38. The purge gas 22, 12 and 14 therefore cannot effectively purge the area of the pressure port 32 and the conduit 30 and to carry away the contaminant particles of ammonium chloride. In order to correct this problem, the process chamber 18 has to be shut down after a predetermined number of deposition cycles such that the conduit 30 (frequently in a bellow form) may be detached from pressure port 32 and be cleaned in a wet acid process. This creates downtime in the deposition equipment and leads to reduced product yield.

It is therefore an object of the present invention to provide a method and apparatus for preventing particle contamination in a semiconductor processing chamber that does not have the drawbacks and shortcomings of prior art methods and apparatus.

It is another object of the present invention to provide a method and apparatus for preventing particle contamination in a semiconductor processing chamber that only requires a minimum modification to the existing processing equipment.

It is a further object of the present invention to provide a method and apparatus for preventing particle contamination in a semiconductor processing chamber that does not require the use of additional chemicals or gases.

It is still another object of the present invention to provide a method and apparatus for preventing particle contamination in a semiconductor processing chamber that utilizes existing purge gas to purge out contaminating particles.

It is yet another object of the present invention to provide a method and apparatus for preventing particle contamination in a semiconductor processing chamber by connecting a purge system between a conduit connecting a pressure sensing device to a manifold and the exhaust system of the processing chamber such that contaminant particles can be carried away from the processing chamber.

SUMMARY OF THE INVENTION

In accordance with the present invention, a method and apparatus for preventing particle contamination in a semiconductor processing chamber by utilizing its existing purge gas is provided.

In the preferred embodiment, a method for preventing particle contamination in a processing chamber that is equipped with a pressure sensor and a conduit connecting the sensor to the chamber can be carried out by providing a contaminant purge system that has a first end and a second end, connecting the first end of the purge system to the conduit such that it is in fluid communication with the conduit, connecting the second end of the purge system to the exhaust system of the chamber such that it is in fluid communication with the exhaust system, and then flowing a purge gas from the processing chamber into the purge system such that the purge gas carries contaminant particles produced in the processing chamber to the exhaust system and away from the chamber.

The present invention is also directed to an apparatus for preventing particle contamination in a semiconductor processing chamber that is equipped with a chamber for receiving a reactant gas mixture, a purge gas and an electronic component to be processed, a manifold adapted for fluid communication with the processing chamber and with a pressure sensing device through a conduit, an air evacuation system for providing a negative pressure in the processing chamber, and exhaust system that is adapted to exhaust spent gases and contaminant particles, and a contaminant purge system which has a first end connected in fluid communication with the conduit and a second end connected in fluid communication with the exhaust system such that a purge gas carries away the contaminant particles to the exhaust system.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENTS

The present invention provides a method and apparatus for preventing particle contamination in a semiconductor processing chamber that is equipped with a processing parameter monitoring device and a conduit connecting the device to the chamber by utilizing a contaminant purge system and a purge gas that is normally used in the processing chamber.

To illustrate the present invention, a low pressure chemical vapor deposition (LPCVD) system for depositing a silicon nitride film is used to exemplify a preferred embodiment of the present invention. The process is selected to conveniently illustrate the present invention method. However, it should be understood that the present invention method and apparatus is in no way limited to a chemical vapor deposition process or to a silicon nitride deposition process. The present invention method can be broadly applied to any other semiconductor processes, including but not limited to, sub-atmospheric pressure chemical vapor deposition, low pressure chemical vapor deposition, plasma enhanced chemical vapor deposition, physical vapor deposition, etching or any other suitable processing methods.

A typical silicon nitride low pressure chemical vapor deposition system carries out a reaction between dichlorosilane ($SiCl_2H_2$) and ammonia ($NH_3$) at a reaction temperature of approximately between about 700° C. and about 800° C. The reaction can be illustrated as follows:

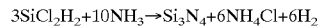

$$3SiCl_2H_2 + 10NH_3 \rightarrow Si_3N_4 + 6NH_4Cl + 6H_2$$

A typical deposition rate for silicon nitride by the LPCVD process is between about 10 nm/min. and about 25 nm/min. The process produces silicon nitride films of good uniformity. However, the stoichiometric ratio of a typical $Si_3N_4$ composition is changed in films produced by this method. For instance, a typical silicon to nitrogen ratio ranges between about 0.7 to about 1.1. The films normally contain hydrogen bonded with both silicon and nitrogen between about 4% and about 8%. The density of the nitride films obtained is between about 2.9 $g/cm^3$ and about 3.1 $g/cm^3$.

Figure 1:
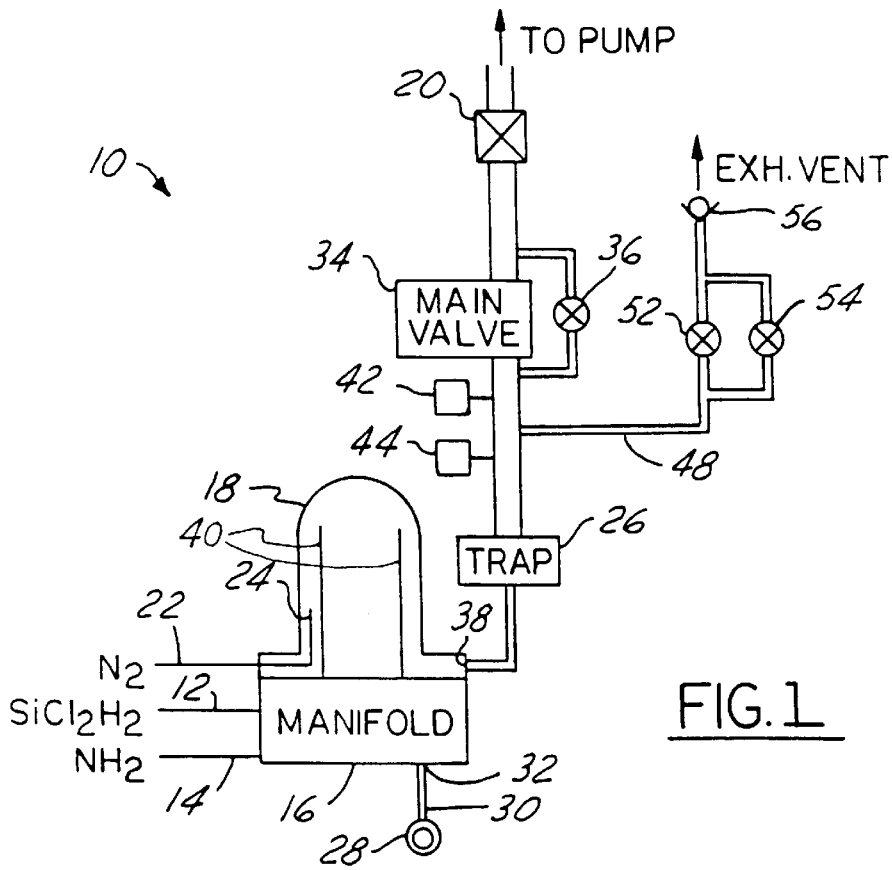
FIG. 1 is a diagram illustrating the configuration of a conventional semiconductor processing chamber for the chemical vapor deposition of silicon nitride films.
Figure 2:
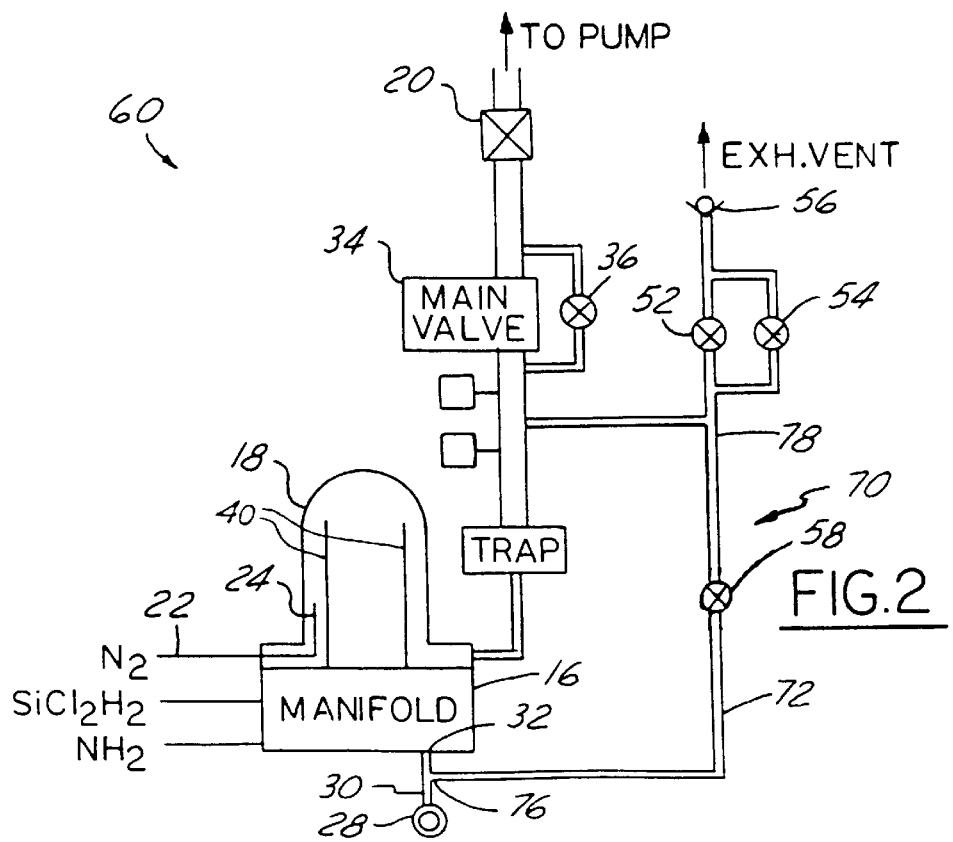
FIG. 2 is a diagram illustrating the configuration of the present invention processing chamber for the chemical vapor deposition of silicon nitride films exemplified in the preferred embodiment.

The present invention novel method and apparatus of preventing particle contamination in a semiconductor processing chamber is illustrated in FIG. 2. As shown in FIG. 2, a low pressure chemical vapor deposition apparatus 60 equipped with a novel contaminant purge system 70 is shown. The novel purge system 70 of the present invention is a vent pipe 72 that can be easily adapted to a conventional chemical vapor deposition system or any other processing systems. The contaminant purge system 72 has a first end 76 connected in fluid communication with the conduit 30 which connects the pressure sensor 28 and the manifold 16. The purge system 72 has a second end 78 that is connected in fluid communication with the exhaust vent 56.

The operation of the novel contaminant purge system 70 can be explained as follows, after each deposition cycle is completed and the wafer boat is withdrawn from chamber 18, purge gas from 22, 12 and 14 is flown into chamber 18 through gas outlet 24. Due to the existence of a pressure differential between the vent pipe 72 and the chamber 18, purge gas from 22, 12 and 14 is drawn into the manifold 16 and then through pressure ports 32 into vent pipe 72. The nitrogen purge gas flow carries substantially all the contaminant particles of ammonium chloride that would otherwise be deposited at pressure port 32 the vent pipes 72 and then exit into the exhaust vent 56. Control valves 58 and 52 operate simultaneously to prevent the process gas from being drawn through vent pipe 72 during a process step (a pumping down step). The nitrogen purge gas may optionally be heated in the chamber 18 to a temperature between about 40° and about 90° C. and then flown through the vent pipe 72 to more efficiently remove the contaminant particles. During the purge cycle, the processing chamber is in an idle status.

It should be noted that even though a pressure sensor 28 is shown attached to the manifold 16, any other processing parameter monitoring device such as a temperature gage which requires the sensing of the reactant gas flow may also be used in place of the pressure sensor 28. It should also be noted that while a purge gas of nitrogen is illustrated in the present invention preferred embodiment, any other inert gas may be suitably used in the present invention method and apparatus. Furthermore, while the deposition of a silicon nitride film is demonstrated in the preferred embodiment, any other film deposition process such as the TEOS oxide film deposition process may also utilize the present invention contaminant purge system to avoid the contamination of the processing chamber by contaminant particles.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for preventing particle contamination in a process chamber equipped with a processing parameter monitoring device and a conduit connecting said device to said chamber comprising the steps of:

providing a process chamber equipped with a manifold, a chamber, a fluid evacuation system and an exhaust system, said manifold being adapted for fluid communication with said chamber, connecting a processing parameter monitoring device through a conduit to said manifold, providing a contaminant purge system having a first end and a second end, connecting the first end of said contaminant purge system to the conduit such that it is in fluid communication with the conduit, connecting the second end of said contaminant purge system to the exhaust system such that it is in fluid communication with the exhaust system, and flowing a purge gas from said chamber into said contaminant purge system such that said purge gas carries contaminant particles deposited in said conduit to said exhaust system and away from said chamber.

2. A method according to claim 1, wherein said process chamber is selected from the group consisting of a chemical vapor deposition (CVD) chamber, a physical vapor deposition (PVD) chamber and an etcher.

3. A method according to claim 1, wherein said processing parameter monitoring device is a pressure sensing device.

4. A method according to claim 1, wherein said process chamber is a CVD chamber for depositing silicon nitride from a reactant gas mixture of $SiCl_2H_2$ and $NH_3$.

5. A method according to claim 1, wherein said purge gas from said chamber is $N_2$.

6. A method according to claim 1, wherein said purge gas from said chamber is heated to a temperature of at least 50° C.

7. A method according to claim 1, wherein said purge gas from said chamber is heated to at least 50° C. and flown at a flow rate of not less than 1000 sccm.

8. A method according to claim 4, wherein said contaminant particles generated are $NH_4Cl$ particles.

9. A method according to claim 1, wherein said process of flowing purge gas in the contaminant purge system to carry contaminant particles generated in said conduit to said exhaust system is carried out after at least one deposition cycle in said process chamber.

10. A method according to claim 1, wherein a pressure differential exists between said conduit and said exhaust system to facilitate the evacuation of said contaminant particles.

11. A process chamber for fabricating electronic components comprising:

a chamber adapted to receive a reactant gas mixture, a purge gas and an electronic component to be processed, a manifold for fluid communication with the chamber and a processing parameter monitoring device through a conduit, a fluid evacuation system for providing a negative pressure in said chamber, an exhaust system adapted to exhaust spent gas and contaminant particles, and a contaminant purge system having a first end connected in fluid communication with the conduit between said processing parameter monitoring device and said manifold, and a second end connected in fluid communication with said exhaust system such that a purge gas carries said contaminant particles to said exhaust system.

12. A process chamber according to claim 11, wherein said contaminant purge system is a vent pipe.

13. A process chamber according to claim 11, wherein said chamber is selected from the group consisting of a CVD chamber, a PVD chamber and an etcher.

14. A process chamber according to claim 11, wherein said chamber is a CVD chamber adapted to receive a reactant gas mixture of $SiCl_2H_2$ and $NH_3$ and a purge gas of $N_2$.

15. A process chamber according to claim 11, wherein said processing parameter monitoring device is a pressure sensor or a temperature sensor.

16. A processing chamber according to claim 15, wherein said conduit connects between a pressure sensor and a manifold.

17. A processing chamber according to claim 14, wherein said contaminant particles are $NH_4Cl$ particles.

18. A processing chamber according to claim 11, wherein said fluid evacuation system is a vacuum pump.

* * * * *